United States Patent
Griffin (10) Patent No.: US 7,936,194 B2
(45) Date of Patent: May 3, 2011

(54) DUAL-REFERENCE DELAY-LOCKED LOOP (DLL)

(75) Inventor: Jed D. Griffin, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 1614 days.

(21) Appl. No.: 11/241,550

(22) Filed: Sep. 30, 2005

(65) Prior Publication Data

US 2007/0076831 A1    Apr. 5, 2007

(51) Int. Cl.
*H03L 7/06* (2006.01)
(52) U.S. Cl. ........................................ 327/158; 327/149
(58) Field of Classification Search ........... 327/147–161
See application file for complete search history.

(56) References Cited

U.S. PATENT DOCUMENTS

| | | | | |
|---|---|---|---|---|
| 5,670,903 | A * | 9/1997 | Mizuno | 327/158 |
| 7,019,573 | B2 * | 3/2006 | Matsuno | 327/161 |
| 7,081,782 | B2 * | 7/2006 | Kizer et al. | 327/158 |

* cited by examiner

Primary Examiner — Dinh T. Le
(74) Attorney, Agent, or Firm — Blakely, Sokoloff, Taylor & Zafman LLP (57) ABSTRACT

Embodiments of the present invention are directed to a dual-reference delay-locked loop that includes a first delay element that delays a clock signal. The rising phase and the falling phase of the delayed clock signal are used as a first and a second reference phases, respectively, for a phase detector. A second delay element delays the first reference signal with a tracking phase that centers between the two reference phases. The phase detector detects a difference between the average of the reference phases and the tracking or resultant phase and outputs a difference signal that biases the delay elements to slew to the left or the right so that the resultant phase is centered between the reference phases corresponding to the rising and falling edges of the incoming clock.

15 Claims, 4 Drawing Sheets

DUAL-REFERENCE DELAY-LOCKED LOOP (DLL)

BACKGROUND

1. Field

Embodiments of the present invention relate to electronic circuits and, in particular, to delay-locked loops or any circuit incorporating phase tracking.

2. Discussion of Related Art

Delay-locked loops may be used for frequency synthesis, windowing techniques in communication interfaces, and/or other clocking applications. Traditional delay-locked loops have limitations however.

One limitation is that the tracking bandwidth, which is proportional to the loop gain, is also proportional to jitter peaking. Loop filtering is typically employed to reduce tracking bandwidth, but loop filtering merely reduces jitter peaking. Thus both poor tracking bandwidth and poor jitter response compromise the overall phase tracking.

Other limitations include longer tracking distance, which leads to increased static phase error, and low closed-loop bandwidth, which leaves a vulnerability to noise-induced jitter, or jitter accumulation, as well as other high frequency effects.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF EMBODIMENTS

Figure 1:
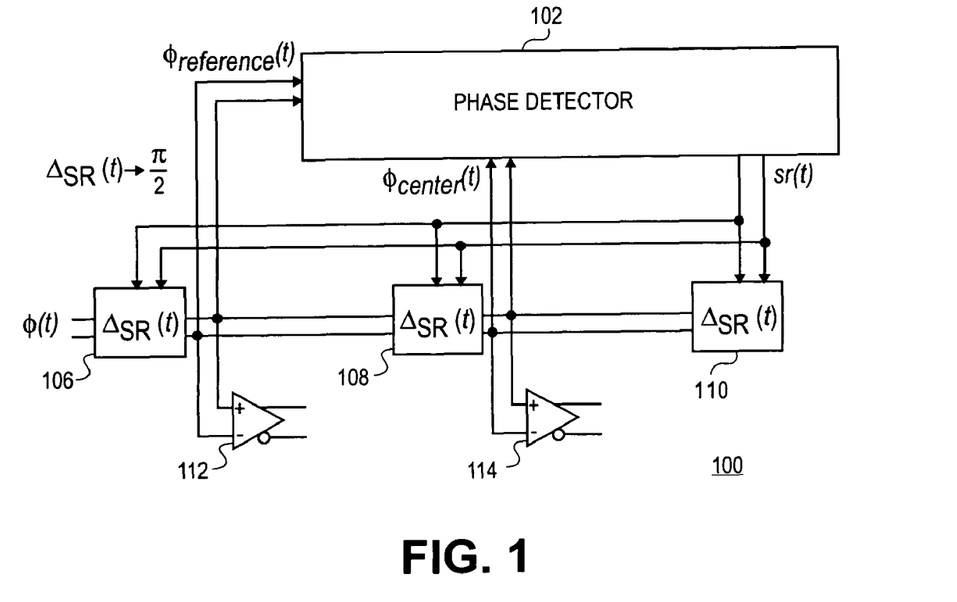
FIG. 1 is a high-level block diagram of a dual-reference delay-locked loop (DLL) according to an embodiment of the present invention.

FIG. 1 is a high-level block diagram of a dual-reference delay-locked loop (DLL) 100 according to an embodiment of the present invention. The illustrated delay-locked loop 100 includes a phase detector 102 coupled to a delay element 106, a delay element 108, and a delay element 110. The delay element 106 is coupled to the delay element 108, which is coupled to the delay element 110. The delay element 108 is coupled to a delay element 110.

According to one embodiment of the present invention, the delay element 106 receives a differential clock signal $\phi(t)$ and delays the differential clock signal $\phi(t)$ to produce a reference clock signal $\phi_{reference}(t)$. The differential clock signal $\phi(t)$ may be a sine wave, a square wave, or other suitable clock signal.

The reference clock signal $\phi_{reference}(t)$ may be coupled to the second delay element 108, which may delay the reference clock signal $\phi_{reference}(t)$ to produce a tracking and/or resultant clock signal $\phi_{center}(t)$. The reference clock signal $\phi_{reference}(t)$ and the tracking and/or resultant clock signal $\phi_{center}(t)$ may be coupled to the phase detector 102.

The tracking and/or resultant clock signal $\phi_{center}(t)$ may include a tracking and/or resultant phase $\theta_{center}(t)$. In one embodiment, the tracking and/or resultant phase $\theta_{center}(t)$ may be the rising edge of the tracking and/or resultant clock signal $\phi_{center}(t)$ when the tracking and/or resultant phase $\theta_{center}(t)$ is between the rising and falling edges of the reference clock signal $\phi_{reference}(t)$. In an alternative embodiment, the tracking and/or resultant phase $\theta_{center}(t)$ may be the falling edge of the tracking and/or resultant clock signal $\phi_{center}(t)$ when the tracking and/or resultant phase $\theta_{center}(t)$ is between the falling and rising edges of the reference clock signal $\phi_{reference}(t)$.

A rising phase $\theta_{low}(t)$ of the reference clock signal $\phi_{reference}(t)$ may be used as a first reference phase for the phase detector 102. A falling phase $\theta_{high}(t)$ of the reference clock signal $\phi_{reference}(t)$ may be used as a second reference phase for the phase detector 102. The phase detector 102 may detect a difference in phase between the tracking and/or resultant phase $\theta_{center}(t)$ of the tracking and/or resultant clock signal $\phi_{center}(t)$ and the average of the rising phase $\theta_{low}(t)$ of the reference clock signal $\phi_{reference}(t)$ and the falling phase $\theta_{high}(t)$ of the reference clock signal $\phi_{reference}(t)$, or $$\theta_{center}(t) - \frac{\theta_{low}(t) - \theta_{high}(t)}{2}$$

The phase detector 102 may amplify this difference in a delay control signal sr(t). In one embodiment, the delay control signal sr(t) proportionally tracks the difference in phase between the tracking and/or resultant phase $\theta_{center}(t)$ of the tracking and/or resultant clock signal $\phi_{center}(t)$ and the average of the rising phase $\theta_{low}(t)$ of the reference clock signal $\phi_{reference}(t)$ and the falling phase $\theta_{high}(t)$ of the reference clock signal $\phi_{reference}(t)$ and communicates this difference to the delay elements 106, 108, and 110.

The delay control signal sr(t) may be used to define the slew rate and hence the delay through the delay elements 106, 108, and 110, and thus the delay control signal sr(t) is annotated slew rate sr(t). The amount of delay through the delay elements 106, 108, and 110 may be substantially equal.

In one embodiment, a closed loop may be formed when the new tracking and/or resultant phase $\theta_{center}(t)$ of the tracking and/or resultant clock signal $\phi_{center}(t)$ is fed back into the phase detector 102 to be re-sampled relative to the same two reference phases. The phase tracking locks when the delay control signal sr(t) converges to a near constant value, which denotes that the tracking and/or resultant phase $\theta_{center}(t)$ is centered between the two reference phases $\theta_{high}(t)$ and $\theta_{low}(t)$).

In one embodiment, the phase detector 102 may multiply the reference clock signal $\phi_{reference}(t)$ and the tracking and/or resultant clock signal $\phi_{center}(t)$ together, inverting the multiplication every other half cycle of the reference clock signal $\phi_{reference}(t)$. The phase detector 102 may then integrate the product of the reference clock signal $\phi_{reference}(t)$ and the tracking and/or resultant clock signal $\phi_{center}(t)$ to define the delay control signal sr(t) by how far and in which direction the tracking and/or resultant phase $\theta_{center}(t)$ of the tracking and/or resultant clock signal $\phi_{center}(t)$ is from the average of the high reference $\theta_{high}(t)$, (shifted by π from the low reference) and the low reference $\theta_{low}(t)$.

Figure 3:
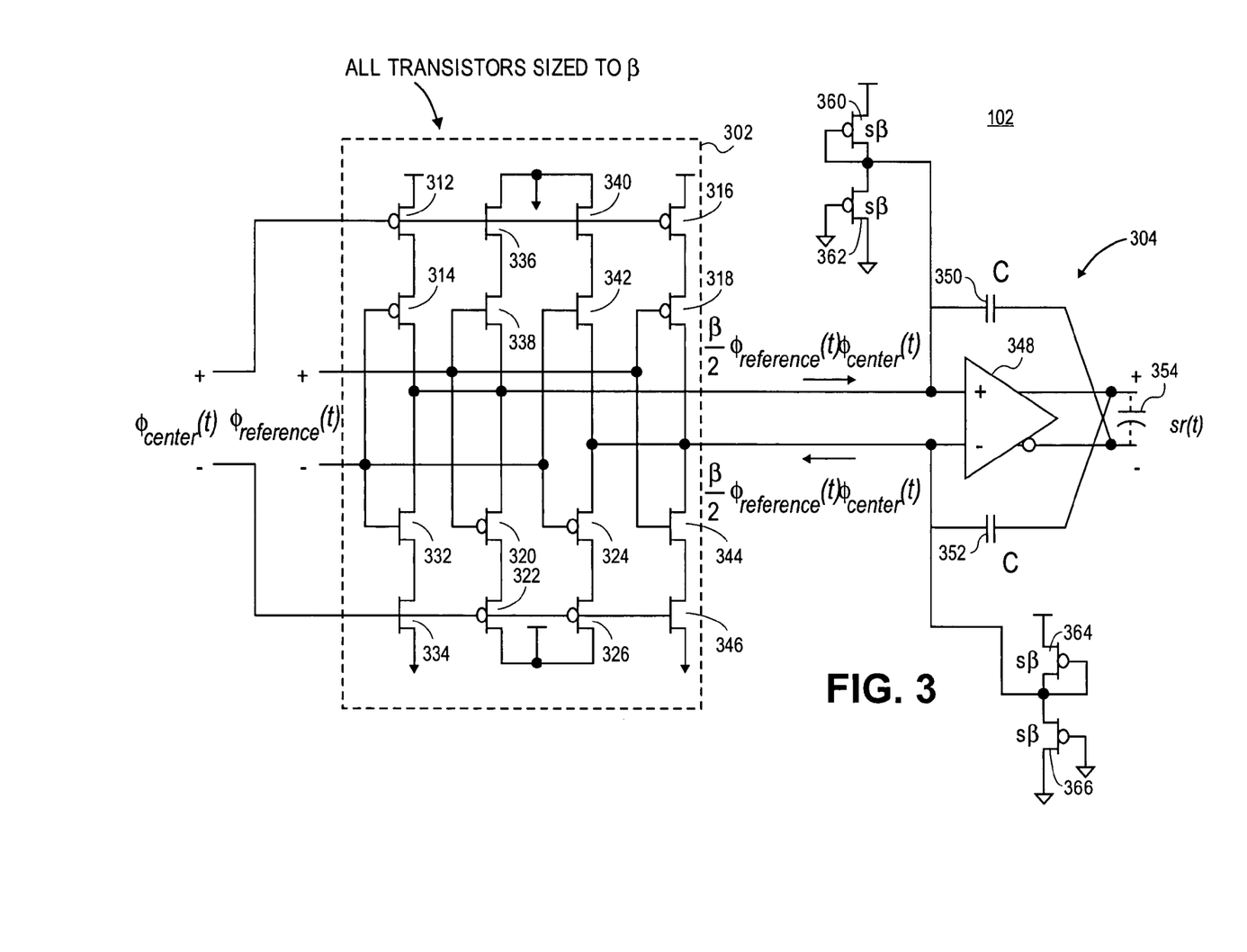
FIG. 3 is a schematic diagram of the phase detector depicted in FIG. 1 according to an embodiment of the present invention.

Operation of the phase detector 102 may be characterized by:

$$\frac{\beta}{C}\int \phi_{reference}(t)\phi_{center}(t)dt \leftrightarrow \frac{\beta[\phi_{reference} * \phi_{center}(s)]}{sC}$$

where β is the size of the transistors in the phase detector 102, C is the value of the capacitance in the active integrator of the phase detector 102 described below with reference to FIG. 3, and s represents the Laplace transform of the function. It should be noted that the multiplication being integrated inverts the sign of the signal that is the product of the reference clock signal $\phi_{reference}(t)$ and the tracking and/or resultant clock signal $\phi_{center}(t)$ every half cycle.

The delay-locked loop 100 may optionally include the operational amplifiers 112 and 114. In the illustrated embodiment, the delay element 106 is coupled to an operational amplifier 112. The delay element 108 is coupled to an operational amplifier 114. The operational amplifiers 112 and 114 may be used to amplify the signals coming out of the delay elements 106 and 108, respectively.

Figure 2:
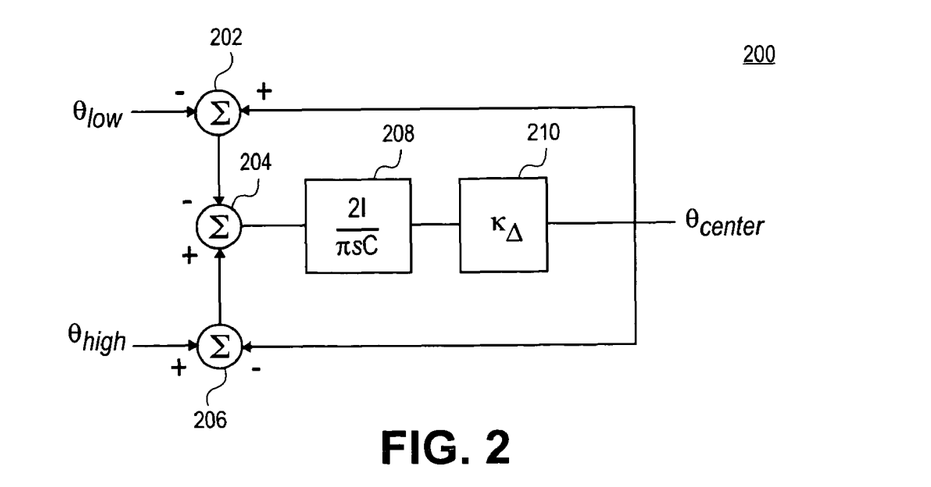
FIG. 2 is a high-level block diagram of the dual-reference delay-locked loop equation, showing the loop gain of the phase detector and delay line depicted in FIG. 1 according to an embodiment of the present invention.

FIG. 2 is a high-level block diagram of the loop equation diagram 200 representing the loop gain of the phase detector 102 and the delay elements 106, 108, and 110 according to an embodiment of the present invention. The loop equation diagram 200 includes three summation junctions 202, 204, and 206. The summation junction 204 is coupled to the input of a block 208. The output of the block 208 is coupled to the input of a block 210. The loop equation diagram 200 depicts how the loop gain is used to amplify the difference in phase between the tracking and/or resultant phase $\theta_{center}(t)$ of the tracking and/or resultant clock signal $\phi_{center}(t)$ and the average of the rising phase $\theta_{high}(t)$ of the reference clock signal and the falling phase $\theta_{high}(t)$ of the reference clock signal to achieve a resultant or center phase.

In the illustrated embodiment, the low reference $\theta_{low}$ is applied to the summation junction 202, the high reference $\theta_{high}$ is applied to the summation junction 206 and the outputs of the summation junctions 202 and 204 are applied to the summation junction 204.

A block 208 along with 202, 204, and 206 represent the integration of the product (inverting every half cycle) of the reference clock signal $\phi_{reference}(t)$ and the tracking and/or resultant clock signal $\phi_{center}(t)$. This is equivalent to taking the difference between the average of the two reference phases, $\theta_{low}(t)$ and $\theta_{high}(t)$, and $\theta_{center}(t)$ in the loop equation diagram 200 and multiplying the difference by a set factor. The Laplace transform of the behavior of block 208 may be characterized by:

$$\frac{2I}{\pi sC}$$

where I represents the amplitude of the multiplication and C represents the value needed to provide the right dampening factor from the integration. Together I and C determine the gain of the phase detector 102, which when multiplied by the delay line gain defines the overall loop gain.

Block 210 corresponds to the delay control signal sr(t) and the delay element $\Delta_{SR}(t)$, determining the value of $\kappa_A$, or the gain of the delay line. If there is a very sensitive delay control signal sr(t), very small variation in sr(t) may result in very large changes in delay through the delay elements 106, 108, and 110. In this way the delay line would contribute to a high loop gain (along with gain from phase detector 102) and may support quick lock-in (fast acquisition time) and/or high tracking bandwidth.

The delay control signal, sr(t), by setting the output slew rate for the delay elements 106, 108, and 110, also may define the delay $\Delta_{SR}(t)$ through delay elements 106, 108, and 110 and also complete a feedback loop in the delay-locked loop 100. Thus, the amount of delay for delaying the clock signal $\phi(t)$ and the reference clock signal $\phi_{reference}(t)$ may be based on the difference between the average of the rising and falling phases of the reference clock signal $\phi_{reference}(t)$ and the resultant phase $\theta_{center}(t)$ of the tracking and/or resultant clock signal $\phi_{center}(t)$. The amount of delay for delaying the clock signal $\phi(t)$ and the reference clock signal $\phi_{reference}(t)$ may also be based on the direction that the tracking and/or resultant phase is from the difference between the average of the rising and falling phases of the reference clock signal and the tracking and/or resultant phase. In one embodiment, the tracking and/or resultant phase $\theta_{center}(t)$ may be centered between the two reference phases $\theta_{low}(t)$ and $\theta_{high}(t)$.

FIG. 3 is a schematic diagram of the phase detector 102 according to an embodiment of the present invention. In the illustrated embodiment, the phase detector 102 includes a four-quadrant analog multiplier 302 coupled to an active integrator 304.

The illustrated four-quadrant analog four-quadrant analog multiplier 302 includes eight p-channel devices 312, 314, 316, 318, 320, 322, 324, and 326, and eight n-channel devices 332, 334, 336, 338, 340, 342, 344, and 346. Power to the devices in the four-quadrant analog multiplier 302 is coupled as follows. The sources of the transistors 312 and 316 and the sources of the transistors 322 and 326 are coupled to $V_{DD}$. The sources of the transistors 334 and 346 and the sources of the transistors 336 and 340 are coupled to $V_{SS}$.

The devices in the four-quadrant analog multiplier 302 are coupled to each other as follows. The drain of the transistor 312 is coupled to the source of the transistor 314. The drain of the transistor 314 is coupled to the drain of the transistor 332. The source of the transistor 332 is coupled to drain of the transistor 334.

The drain of the transistor 336 is coupled to the source of the transistor 338. The drain of the transistor 338 is coupled to the drain of the transistor 320. The source of the transistor 320 is coupled to the drain of the transistor 322.

The drain of the transistor 340 is coupled to the source of the transistor 342. The drain of the transistor 342 is coupled to the drain of the transistor 324. The source of the transistor 324 is coupled to the drain of the transistor 326. The drain of the transistor 316 is coupled to the source of the transistor 318.

The drain of the transistor 318 is coupled to the drain of the transistor 344. The drain of the transistor 344 is coupled to the source of the transistor 318. The source of the transistor 344 is coupled to the drain of the transistor 346.

In the illustrated embodiment, the reference clock signal $\phi_{reference}(t)$ are differential signals coupled to the four-quadrant analog multiplier 302 as follows. The gates of the transistors 318, 338, 320, and 344 are coupled to receive the positive going differential reference clock signal $\phi_{reference}(t)$ and the gates of the transistors 314, 332, 324, and 342 are coupled to receive the negative going differential reference clock signal $\phi_{reference}(t)$.

In the illustrated embodiment, the tracking and/or resultant clock signal $\phi_{center}(t)$ are differential signals coupled to the four-quadrant analog multiplier 302 as follows. The gates of the transistors 312, 336, 340, and 316 are coupled to receive the positive going differential tracking and/or resultant clock signal $\phi_{center}(t)$ and the gates of the transistors 334, 322, 326, and 346 are coupled to receive the negative going differential tracking and/or resultant clock signal $\phi_{center}(t)$.

In the illustrated embodiment, the output of the four-quadrant analog multiplier 302 is a differential signal that is the product of the reference clock signal $\phi_{reference}(t)$ and the tracking and/or resultant clock signal $\phi_{center}(t)$. The positive output out of the four-quadrant analog multiplier 302 is taken from the drains of the transistors 332 and 320. The negative output out of the four-quadrant analog multiplier 302 is taken from the drains of the transistors 324 and 344.

The outputs of the four-quadrant analog multiplier 302 are coupled to the integrator 304. In the illustrated embodiment, the integrator 304 includes an operational amplifier 348, three capacitors 350, 352, and optional capacitor 354, and four p-channel transistors 360, 362, 364, and 368.

Power to the devices in the analog integrator 304 is coupled as follows. The drains of the transistors 360 and 364 are coupled to $V_{DD}$. The sources of the transistors 362 and 366 are coupled to $V_{SS}$.

The devices in the analog integrator 304 are coupled to each other as follows. The drain of the transistor 360 is coupled to the source of the transistor 362, to the gate of the transistor 360, to a first terminal of the capacitor 350 and to the positive input of the operational amplifier 348. The drain of the transistor 364 is coupled to the source of the transistor 366, to the gate of the transistor 364, to a first terminal of the capacitor 352 and to the negative input of the operational amplifier 348.

A second terminal of the capacitor 350 is coupled to the negative output of the operational amplifier 348 and to a first terminal of the capacitor 354. A second terminal of the capacitor 352 is coupled to the positive output of the operational amplifier 348 and to a second terminal of the capacitor 354.

In one embodiment, the transistors 360, 362, 364, and 366 provide a direct current (DC) bias to the inputs of the operational amplifier 348. Applying the same DC bias on both inputs to the operational amplifier 348 fixes a common mode of operation, which may allow more stable integration of the signals output from the four-quadrant analog multiplier 302.

In one embodiment, the transistors in the four-quadrant analog multiplier 302 are sized to $\beta$ and the transistors in the analog integrator 304 are sized to $s\beta$. The $s\beta$ is a scale factor that is s times the Beta value of the transistors in the four-quadrant analog multiplier 302. In one embodiment, the ratio of s may be set to a value that is high enough to stabilize the active integrator 304 but not so high that multiplication of the reference clock signal $\phi_{reference}(t)$ and the tracking and/or resultant clock signal $\phi_{center}(t)$ is completely attenuated.

Without the optional capacitor 354, the integrator 304 may be an active integrator. With the optional capacitor 354 placed between the differential outputs of the operational amplifier 348 and shorting out the capacitors 350 and 352 the analog integrator 304 may become a passive analog integrator. In one embodiment, the capacitors 350 and 352 may be metal capacitors.

In one embodiment, the active integrator 304 may be initialized to a saturated negative value. In this embodiment, there may be optimal convergence of the delay control signal sr(t) to a near constant value by initializing the slew-rate controlled delay of the delay elements 106, 108, and 110 to a shortest delay.

Although shown as an analog integrator, the integrator 304 may be a digital integrator.

In one embodiment, the output of the phase detector 102 may be characterized by:

$$\frac{\beta}{C}\int \phi_{reference}(t)\phi_{center}(t)dt \leftrightarrow \frac{\beta[\phi_{reference} * \phi_{center}(s)]}{sC}$$

Figure 4:
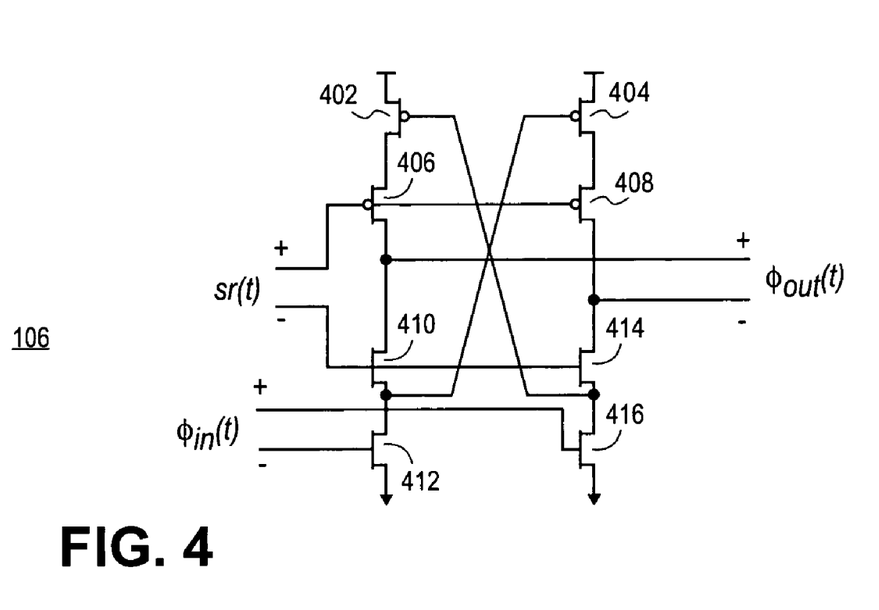
FIG. 4 is a schematic diagram of a slew-rate controlled delay element according to an embodiment of the present invention.

FIG. 4 is a schematic diagram of the any one of the delay elements 106, 108, and/or 110 according to an embodiment of the present invention. For ease of explanation herein, the delay element will be referred to as delay element 106. The illustrated delay element 106 includes four p-channel devices 402, 404, 406, and 408 and four n-channel devices 410, 412, 414, and 416.

In one embodiment, the delay of the slew rate controlled delay or delay element $\Delta_{SR}(t)$ 106 is proportional to $SR_\Delta$, which may be characterized by:

$$SR_{\Delta(MAX)} \propto \frac{\beta_\Delta(V_{DD} - V_T)^2}{(WL)_\Delta}$$

where W is the width of the input transistors 412 and 416, L is the length of the input transistors 412 and 416, $\beta_\Delta$ is the size of the input transistors 402, 404, 406, 408, 410, 412, 414 and 416, and $V_T$ is the threshold voltage of the input transistors 412 and 416.

Power to the devices in the delay element 106 is coupled as follows. The sources of the transistors 402 and 404 are coupled to $V_{DD}$. The sources of the transistors 412 and 416 are coupled to $V_{SS}$.

The devices in the delay element 106 are coupled to each other as follows. The gate of the transistor 402 is coupled to the drain of the transistor 416 and the gate of the transistor 404 is coupled to the drain of the transistor 412. The drain of the transistor 402 is coupled to the source of the transistor 406. The drain of the transistor 406 is coupled to the drain of the transistor 410. The source of the transistor 410 is coupled to the drain of the transistor 412. The drain of the transistor 404 is coupled to the source of the transistor 408. The drain of the transistor 408 is coupled to the drain of the transistor 414. The source of the transistor 414 is coupled to the drain of the transistor 416.

In the illustrated embodiment, delay control signal sr(t) is coupled from the integrator 304 portion of the phase detector 102 to the delay element 106 on the gates of the transistors 406 and 408 and the gates of the transistors 410 and 414. In the illustrated embodiment, the differential clock signal $\phi_{in}(t)$ is coupled to the delay element 106 on the gates of the transistors 412 and 416.

In the illustrated embodiment, the outputs of the delay elements 106, 108, and/or 110 are taken from the drains of the transistors 410 and 414. If the output is taken from the drains of the transistors 410 and 414 in the delay element 106, then the output may be the reference clock signal $\phi_{reference}(t)$. If the output is taken from the drains of the transistors 410 and 414 in the delay element 108, then the output may be the tracking and/or resultant clock signal $\phi_{center}(t)$.

Figure 5:
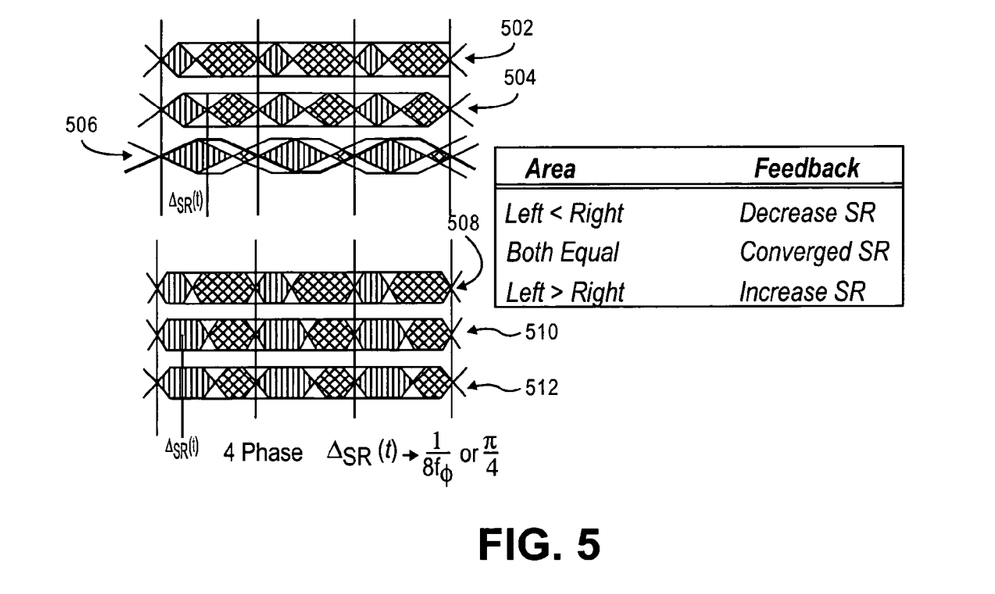
FIG. 5 is a graphical representation of the change in delay $\Delta_{SR}$ for the delay element depicted in FIG. 1 based on the slew rate or the tracking and/or resultant clock signal according to an embodiment of the present invention.

FIG. 5 is a graphical representation of the convergence in delay $\Delta_{SR}$, until the tracking and/or resultant phase is centered between the 2 reference phases. It is a delta delay based on the value of sr(t), and correspondingly aligns the phase of the tracking and/or resultant clock signal $\phi_{center}(t)$ according to an embodiment of the present invention. FIG. 5 includes six envelopes 502, 504, 506, 508, 510, and 512.

The envelopes 502, 504, and 506 illustrate operation for a delay-locked loop 100 having two delay elements 106 and 108 and perhaps the delay element 110 used as a dummy load. The envelopes 508, 510, and 512 illustrate operation for a delay-locked loop 100 having four delay elements. The case of too fast a slew rate out of the delay element, or too short a delay, is shown in 502 and 508. The case of too slow a slew rate out of the delay element, or too long of a delay is shown in 506 and 512. The case of converged slew rate, when the tracking phase is centered, is depicted in 504 and 510.

If the area in the example envelopes 502 and 508 are skewed less to the left than to the right, the phase detector 102 may decrease the feedback to the associated delay elements to move the tracking and/or resultant clock signal $\phi_{center}(t)$ to the right in an attempt to center the tracking and/or resultant clock signal $\phi_{center}(t)$ between the rising edge and the falling edge of the reference clock signal $\phi_{reference}(t)$, for example. The example envelopes 506 and 512 are skewed more to the left than to the right. The phase detector 102 in this embodiment may increase the feedback to the associated delay elements to move their associated tracking and/or resultant clock signal $\phi_{center}(t)$ to the left.

The behavior of the delay-locked loop 100 may be characterized in the frequency domain by:

$$\frac{\theta_{center}}{\frac{\theta_{low} + \theta_{high}}{2}} = \frac{1}{\frac{\pi s C}{4 I \kappa_\Delta} + 1}$$

The Laplace transform of the behavior of the delay-locked loop 100 may be characterized by:

$$\frac{1}{\frac{s}{G} + 1} \leftrightarrow G e^{-Gt}$$

where G represents loop gain as represented in the loop gain diagram 200 and defined in the loop equation.

Figure 6:
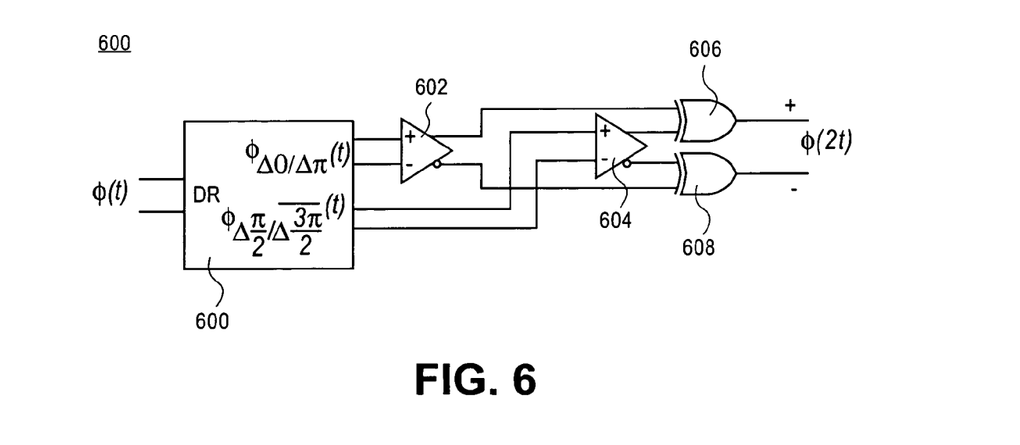
FIG. 6 is a high-level block diagram of a frequency multiplier according to an embodiment of the present invention.

The delay-locked loop 100 may be used in a variety of applications. For example, the delay-locked loop 100 may be used in high speed serial links, windowing circuitry, and frequency multipliers. FIG. 6 is a high-level block diagram of a frequency multiplier 600 according to an embodiment of the present invention. The frequency multiplier 600 includes the delay-locked loop 100 coupled to two possibly optional comparators 602 and 604. In one embodiment, the devices 602 are the same as the devices 112 and 114. In other embodiments, the devices 602 and 604 may be differential amplifiers. In still other embodiments, the devices 602 and 602 are not present. The comparators 602 and 604 are coupled to two exclusive OR gates 606 and 608.

The comparator 602 has a differential input coupled with the same polarity to the first reference signal or the reference clock signal $\phi_{reference}(t)$. A first (positive) output of the comparator 602 is coupled to a first input of the exclusive OR gate 606. A second output (negative) of the comparator 602 is coupled to a first input of the exclusive OR gate 608.

The comparator 604 has a differential input coupled with the same polarity to the second reference signal or the tracking and/or resultant clock signal $\phi_{center}(t)$. A first output of the comparator 604 is coupled to a second input of the exclusive OR gate 606. A second output of the operational amplifier 602 is coupled to a second input of the exclusive OR gate 608. Optionally, comparators 602 and 604 may be removed, shorting inputs to corresponding outputs maintaining the same polarity.

The input to the frequency multiplier 600 is differential clock signal $\phi(t)$, which is applied to the delay-locked loop 100 input. The output of the frequency multiplier 600 is a differential clock with double the frequency of the input differential clock signal $\phi(t)$, and is taken from the exclusive OR gates 606 and 608 output terminals.

While embodiments of the present invention may be described with reference to complementary metal oxide semiconductor (CMOS) technology, it should be appreciated that embodiments of the present invention are not so limited. For example, embodiments of the present invention may be implemented in bipolar technology, using silicon, gallium arsenide (GaAs) or any other high mobility semiconductor.

Embodiments of the present invention may be implemented using hardware, software, or a combination thereof. In implementations using software, the software may be stored on a machine-accessible medium.

In the above description, numerous specific details, such as, for example, particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. An apparatus, comprising:
    a delay-locked loop having:
        a first delay element to delay a clock signal and to output a reference clock signal, a rising phase of the reference clock signal being a first reference phase and a falling phase of the reference clock signal being a second reference phase;
        a second delay element to delay the reference clock signal and to output a tracking clock signal having tracking phase to track the first and second reference phases; and
        a phase detector, coupled to receive the reference clock signal and the tracking clock signal and to output a difference signal, the difference signal to represent a difference between the tracking phase and an average of the first and second reference phases, the difference signal to control a delay of the first and the second delay elements.

2. The apparatus of claim 1, wherein the phase detector comprises:
a four-quadrant multiplier to multiply the reference clock signal times the tracking clock signal; and
an analog integrator to integrate the multiplication of the reference and tracking clock signals and to output the difference signal based on how far and in which direction the tracking phase is from an average of the first and second reference phases.

3. The apparatus of claim 2, wherein the analog integrator comprises a passive or an active integrator.

4. The apparatus of claim 2, wherein the four-quadrant multiplier comprises:
a first n-channel transistor;
a second n-channel transistor;
a third n-channel transistor;
a fourth n-channel transistor;
a fifth n-channel transistor;
a sixth n-channel transistor;
a seventh n-channel transistor;
an eighth n-channel transistor, wherein each n-channel transistor includes a source, a drain, and a gate;
a first p-channel transistor;
a second p-channel transistor;
a third p-channel transistor;
a fourth p-channel transistor;
a fifth p-channel transistor;
a sixth p-channel transistor;
a seventh p-channel transistor; and
an eighth p-channel transistor, wherein each p-channel transistor includes a source, a drain, and a gate,
wherein the sources of the first and third p-channel transistors and the sources of the sixth and eighth p-channel transistors are coupled to $V_{DD}$,
wherein the sources of the second and eighth n-channel transistors and the sources of the third and fifth n-channel transistors are coupled to $V_{SS}$,
wherein the drain of the first p-channel transistor is coupled to the source of the second p-channel transistor,
wherein the drain of the second p-channel transistor is coupled to the drain of the first n-channel transistor,
wherein the source of the first n-channel transistor is coupled to the drain of the second n-channel transistor,
wherein the drain of the third n-channel transistor is coupled to the source of the fourth n-channel transistor,
wherein the drain of the fourth n-channel transistor is coupled to the drain of the fifth p-channel transistor,
wherein the source of the fifth p-channel transistor is coupled to the drain of the sixth p-channel transistor,
wherein the drain of the fifth n-channel transistor is coupled to the source of the sixth n-channel transistor,
wherein the drain of the sixth n-channel transistor is coupled to the drain of the seventh p-channel transistor,
wherein the source of the seventh p-channel transistor is coupled to the drain of the eighth p-channel transistor,
wherein the drain of the third p-channel transistor is coupled to the source of the fourth p-channel transistor,
wherein the drain of the fourth p-channel transistor is coupled to the drain of the seventh n-channel transistor,
wherein the source of the seventh n-channel transistor is coupled to the drain of the eighth n-channel transistor,
wherein the gates of the fourth n-channel transistor, the fourth p-channel transistor, the fifth p-channel transistor, and the seventh n-channel transistor are to receive a plus portion of the reference clock signal,
wherein the gates of the second p-channel transistor, the first n-channel transistor, the seventh p-channel transistor, and the sixth n-channel transistor are to receive a minus portion of the reference clock signal,
wherein the gates of the first p-channel transistor, the third p-channel transistor, the third n-channel transistor, and the fifth n-channel transistor are to receive a plus portion of the tracking clock signal,
wherein the gates of the second n-channel transistor, the sixth p-channel transistor, the eighth p-channel transistor, and the eighth n-channel transistor are to receive a minus portion of the tracking clock signal,
wherein the plus output of the four-quadrant multiplier is coupled to the drains of the first n-channel transistor and the fifth p-channel transistor, and
wherein the minus output of the four-quadrant multiplier is coupled to the drains of the seventh p-channel transistor and the seventh n-channel transistor.

5. The apparatus of claim 2, wherein the first and second delay elements comprise:
a first n-channel transistor having a source, a drain, and a gate;
a second n-channel transistor having a source, a drain, and a gate;
a third n-channel transistor having a source, a drain, and a gate; and
a fourth n-channel transistor having a source, a drain, and a gate,
a first p-channel transistor having a source, a drain, and a gate;
a second p-channel transistor having a source, a drain, and a gate;
a third p-channel transistor having a source, a drain, and a gate; and
a fourth p-channel transistor having a source, a drain, and a gate,
wherein the sources of the first and second p-channel transistors are coupled to $V_{DD}$,
wherein the drain of the first p-channel transistor is coupled to the source of the third p-channel transistor,
wherein the drain of the third p-channel transistor is coupled to the drain of the third n-channel transistor,
wherein the source of the third n-channel transistor is coupled to the drain of the first n-channel transistor,
wherein the drain of the second p-channel transistor is coupled to the source of the fourth p-channel transistor,
wherein the drain of the fourth p-channel transistor is coupled to the drain of the fourth n-channel transistor,
wherein the source of the fourth n-channel transistor is coupled to the drain of the second n-channel transistor,
wherein the sources of the first and second n-channel transistors are coupled to $V_{SS}$,
wherein the gates of the third and the fourth p-channel transistors and the gates of the third and the fourth n-channel transistors are to receive a positive signal output from the analog integrator and a negative signal output from the analog integrator, respectively,
wherein the gate of the first p-channel transistor is coupled to the drain of the second n-channel transistor,
wherein the gate of the second p-channel transistor is coupled to the drain of the first n-channel transistor, and
wherein the gates of the first and the second n-channel transistors are to receive the clock signal.

6. The apparatus of claim 5, wherein the reference clock signal is taken from the drain of the third p-channel transistor and the drain of the fourth p-channel transistor of the first delay element.

7. The apparatus of claim 5, wherein the tracking clock signal is taken from the drain of the third p-channel transistor and the drain of the fourth p-channel transistor of the second delay element.

8. The apparatus of claim 1, wherein the difference signal is to control the slew rate of the first and the second delay elements.

9. A method of operating a delay-locked loop, the method comprising:
  delaying a clock signal to produce a reference clock signal having a rising edge and falling edge, the rising edge being a first reference phase and the falling edge being the second reference phase;
  delaying the reference clock signal to produce a resultant clock signal having a resultant phase;
  generating a difference signal that is proportional to a difference between the resultant phase and the average of the first reference phase and the second reference phase; and
  using the difference signal to adjust an amount of delay for delaying the clock signal and the reference clock signal by substantially the same amount.

10. The method of claim 9, further comprising using feedback to center the resultant phase of the resultant clock signal between a leading edge of a first half cycle of the reference clock signal and a trailing edge of the first half cycle of the reference clock signal.

11. The method of claim 10, further comprising using feedback to center the resultant phase of the resultant clock signal between a leading edge of a last half cycle of the reference clock signal and a trailing edge of the last half cycle of the reference clock signal.

12. The method of claim 9, further comprising:
  multiplying the reference clock signal by the resultant clock signal;
  integrating the multiplication of the reference and resultant clock signals;
  defining by how far the resultant phase is from the difference between the resultant phase and an average of the rising and falling phases of the reference clock signal; and
  defining in which direction the resultant phase is from the difference between the resultant phase and an average of the rising and falling phases of the reference clock signal.

13. The method of claim 12, further comprising adjusting an amount of delay for delaying the clock signal and the reference clock signal based on an amplitude of the resultant phase with respect to the difference between the resultant phase and an average of the rising and falling phases of the reference clock signal.

14. The method of claim 13, further comprising adjusting the amount of delay for delaying the clock signal and the reference clock signal based on a direction the resultant phase is from the difference between the resultant phase and an average of the rising and falling phases of the reference clock signal.

15. The method of claim 14, further comprising:
  using feedback to adjust the amount of delay for delaying the clock signal and the reference clock signal; and
  converging to a steady state tracking of the resultant phase substantially to the center of the rising and falling phases of the reference clock signal.

\* \* \* \* \*